United States Patent
Badia

(10) Patent No.: US 10,123,409 B2
(45) Date of Patent: Nov. 6, 2018

(54) FLEXIBLE PRINTED CIRCUIT BOARD AND LIGHT MODULE FOR A MOTOR VEHICLE COMPRISING SUCH A PRINTED CIRCUIT BOARD

(71) Applicant: Valeo Vision, Bobigny (FR)

(72) Inventor: Olivier Badia, Villiers sur Marne (FR)

(73) Assignee: Valeo Vision, Bobigny (FR)

( * ) Notice: Subject to any disclaimer, the term of this patent is extended or adjusted under 35 U.S.C. 154(b) by 4 days.

(21) Appl. No.: 15/296,435

(22) Filed: Oct. 18, 2016

(65) Prior Publication Data

US 2017/0118835 A1    Apr. 27, 2017

(30) Foreign Application Priority Data

Oct. 21, 2015   (FR) ...................... 15 60046

(51) Int. Cl.
*H05K 1/02*   (2006.01)
*H05K 1/03*   (2006.01)
*B60Q 1/04*   (2006.01)

(52) U.S. Cl.
CPC ............. *H05K 1/0281* (2013.01); *B60Q 1/04* (2013.01); *H05K 1/0393* (2013.01); *H05K 2201/0154* (2013.01); *H05K 2201/09009* (2013.01); *H05K 2201/10121* (2013.01)

(58) Field of Classification Search
CPC ....... H05K 3/3452; H05K 2201/10287; H05K 1/0206
See application file for complete search history.

(56) References Cited

U.S. PATENT DOCUMENTS

| 8,408,769 B2 | 4/2013 | Nicolai et al. |
| 9,769,919 B2 * | 9/2017 | Park ...................... H05K 1/147 |
| 2015/0257289 A1 | 9/2015 | Lee et al. |

FOREIGN PATENT DOCUMENTS

| DE | 4237083 A1 | 5/1994 |
| EP | 2298599 A1 | 3/2011 |

* cited by examiner

*Primary Examiner* — Timothy Thompson
*Assistant Examiner* — Amol Patel
(74) *Attorney, Agent, or Firm* — Oblon, McClelland, Maier & Neustadt, L.L.P.

(57) ABSTRACT

A flexible printed circuit board, configured to receive electronic components, comprising an electrically insulating flexible element, configured to bear conductive component-connecting tracks, the flexible element being further configured to be bent according to a curvature, the board further comprising an electrically insulating reinforcing element, mechanically secured to the flexible element, extending on one side of the curvature, and comprising two parts: a first part being substantially planar and a second part exhibiting a predefined curvature, arranged on the side of the curvature of the flexible element, the reinforcing element being arranged so as to leave a free part for the flexible element to be bent according to the curvature.

16 Claims, 2 Drawing Sheets

Figure 1:
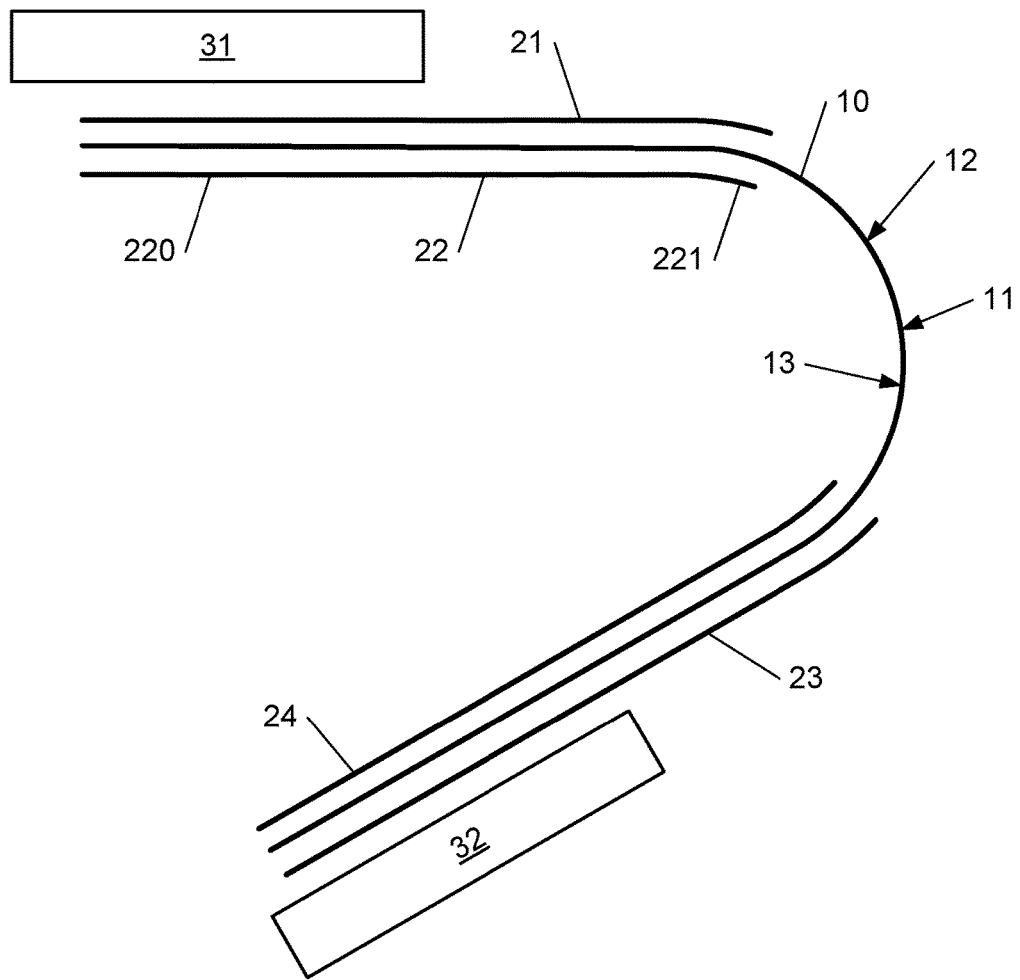

FLEXIBLE PRINTED CIRCUIT BOARD AND LIGHT MODULE FOR A MOTOR VEHICLE COMPRISING SUCH A PRINTED CIRCUIT BOARD

CROSS-REFERENCE TO RELATED APPLICATIONS

This application claims priority to the French application 1560046, filed Oct. 21, 2015, which application is incorporated herein by reference and made a part hereof.

BACKGROUND OF THE INVENTION

1. Field of the Invention

The subject of the invention is a flexible printed circuit board.

It is particularly applicable in the context of the mounting of the flexible printed circuit board in a dynamic and/or flexible light module, in particular a lighting headlight for a motor vehicle.

2. Description of the Related Art

Printed circuit boards are commonly used to ensure the mounting and the interconnection of electronic components. They are generally composed of a rigid plastic and metal substrate, on which conductive electrical connection tracks are deposited onto which electronic components are soldered.

It is known practice to use flexible printed circuit boards, when the application requires it, which are generally produced using substrates made of high-efficiency flexible plastics, such as polyimides. For example, the patent document EP2298599A1, which is equivalent to U.S. Publication No. 2011/0103086 issued as U.S. Pat. No. 8,408,769, discloses an optical module equipped with an electrical connection member comprising a flexible element incorporating electrical conductors.

However, in some applications where there is little space available where the mechanical environment is very restrictive, the bending radius imposed on the flexible printed circuit can be very small and risk, above all in a dynamic context, in other words when the printed circuit board links two electronic components in motion relative to one another, damaging the printed circuit board and its conductive tracks.

SUMMARY OF THE INVENTION

The aim of the invention is to resolve this difficulty by obtaining a solution that is simple, has little bulk, requires a minimum of additional parts, is not costly, while allowing for a satisfactory reliability and an easy and therefore rapid assembly of the various elements of the device in which it is mounted.

To this end, the subject of the invention is a flexible printed circuit board configured to receive electronic components, comprising an electrically insulating flexible element configured to bear conductive component-connecting tracks, the flexible element being further configured to be bent according to a curvature, the board further comprising at least one electrically insulating reinforcing element mechanically secured to the flexible element, extending on one side of the curvature, and comprising two parts:

a first part being substantially planar; and
a second part exhibiting a predefined curvature arranged on the side of the curvature of the flexible element, the reinforcing element being arranged so as to leave a free part for the flexible element to be bent according to the curvature.

In this way, the reinforcing elements follow the curvature of the flexible element over their second part while making it possible to limit it and to accurately manage the remaining curvature, the bending radius and the length available of the flexible element being then determined, thus avoiding excessively small bending radii likely to damage the flexible element and thus improving the reliability of the assembly.

According to different embodiments of the invention, which will be able to be taken together or separately:

the printed circuit board further comprises at least one stiffening element arranged on the same side of its free part as the reinforcing element and fixed to the flexible element or to the reinforcing element;

the reinforcing element is arranged on the inner face of the flexible element;

the reinforcing element is arranged on the outer face of the flexible element;

the printed circuit board comprises a second reinforcing element, each of the reinforcing elements extending on either side of the curvature and the reinforcing elements being arranged so as to leave between them the free part for the flexible element to be bent according to the curvature;

the printed circuit board comprises at least two stiffening elements, arranged on either side of its free part and each fixed to the flexible element or respectively to one of the reinforcing elements;

the printed circuit board comprises four reinforcing elements, arranged facing on either side of the flexible element;

the flexible element comprises polyimide;

the flexible element has a thickness of approximately 110 micrometers;

the reinforcing elements comprise polyamide; and the reinforcing elements have a thickness of approximately 100 to 600 micrometers.

The invention relates also to a light module for a lighting and/or signaling device, notably for a motor vehicle, comprising a printed circuit board according to the invention, the stiffening elements being also fixed to a component of the module.

According to another embodiment of the invention, one of the stiffening elements is fixed to a fixed component of the module and the other of the stiffening elements to a mobile component of the module. It is also possible for one of the stiffening elements to be fixed to a first component of the module and the other of the stiffening elements to be fixed to a second component of the module, the two components of the module being provided to be in motion relative to one another.

In this latter embodiment, where there is a moving, or dynamic, mechanical environment, the invention makes it possible to follow the movements of the curvature linked to the movement of the component(s) of the module and thus avoid any geometry of the board likely to damage it.

These and other objects and advantages of the invention will be apparent from the following description, the accompanying drawings and the appended claims.

BRIEF DESCRIPTION OF THE ACCOMPANYING DRAWINGS

Figure 2:
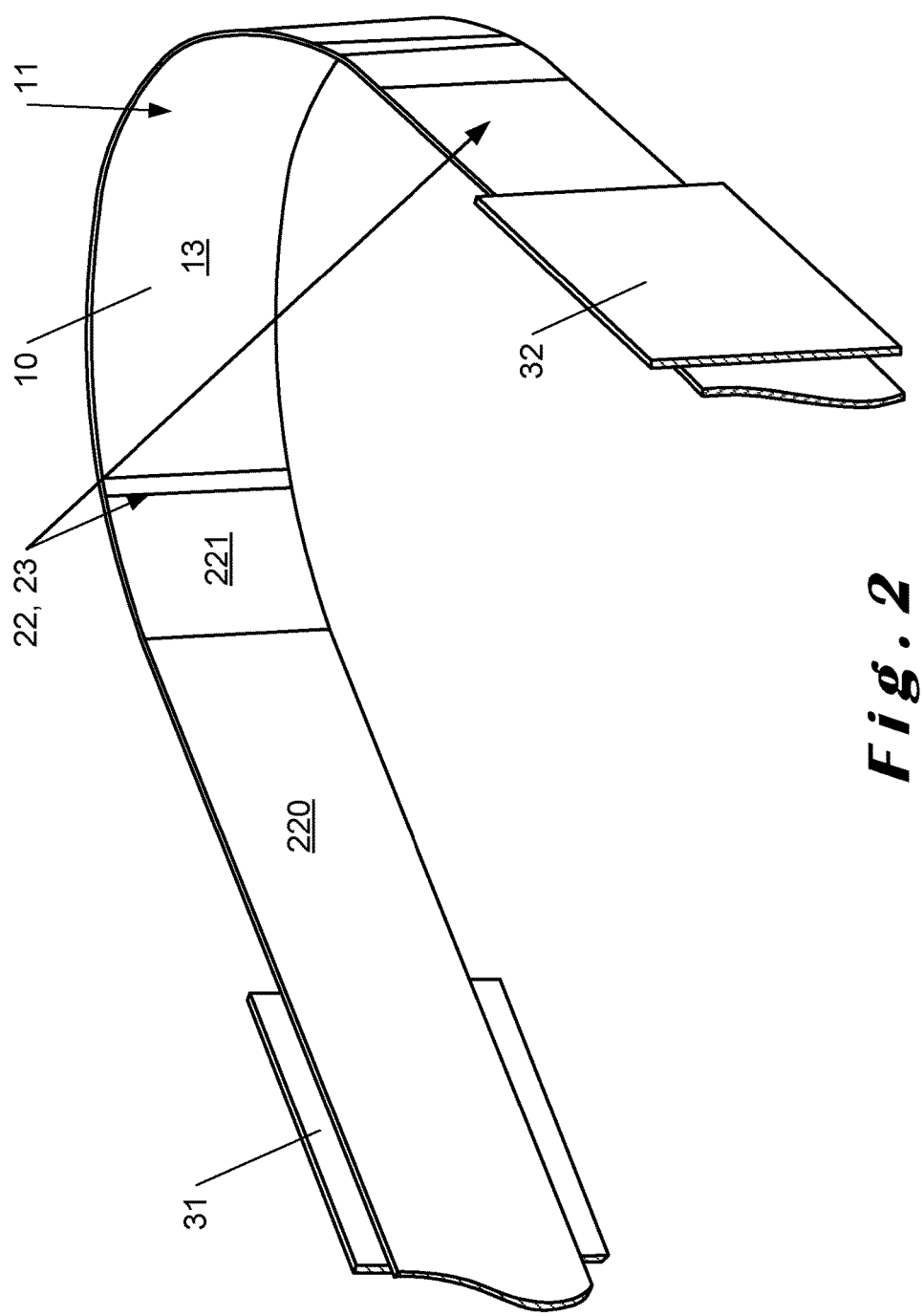

Other features and advantages of the invention will emerge from the following detailed description, given by way of indication and illustrated by the attached drawings, which represent:

FIG. 1 is a schematic plan view of an embodiment of the flexible printed circuit board according to the invention; and FIG. 2 is a schematic perspective view of the printed circuit board of FIG. 1.

In these different figures, the same references relate to the same elements.

DETAILED DESCRIPTION OF THE PREFERRED EMBODIMENTS

FIG. 1 represents an embodiment of the printed circuit board according to the invention, seen schematically from above.

The board comprises electronic components (not represented) and an electrically insulating flexible element 10, bearing conductive tracks (also not represented) on one or both of its faces, intended to interconnect the components with one another and with electrical circuits external to the board.

The flexible element 10 comprises, for example, a high-efficiency plastic substrate, such as a polyimide. Its thickness can be conventionally approximately 110 micrometers. In the figure, a part of the flexible element 10 is represented, on either side of a great curvature (greater than 90°) in its central part 11.

The printed circuit board according to the invention preferentially comprises at least two reinforcing elements 22 and 24. They are arranged on either side of the central part 11 of the flexible element 10, for example on the same face thereof, for example on the inner face 13 relative to the curvature, by leaving free the central part 11 of the flexible element 10. It is also possible for the two reinforcing elements 22 and 24 to be placed on the outer face 12 relative to the curvature or on opposite faces.

In FIG. 1, the printed circuit board comprises four reinforcing elements 21, 22, 23, 24, the additional two reinforcing elements 21 and 23 being arranged on the other face of the flexible element 10, the outer face 12 facing the reinforcing elements 22 and 24 respectively.

Each of these reinforcing elements 21-24 is electrically insulating and made mechanically secure to the flexible element 10, for example by bonding. They are intended to reinforce the mechanical strength of the flexible element 10 in the vicinity of the curvature in the central part 11. They are for example, made of polyamide, with a thickness of approximately 100 to 600 micrometers.

Each of the reinforcing elements 21-24 comprises at least two parts, the first part 220 being substantially planar and the second part 221 exhibiting a predefined bending radius greater than that of the central part 11. The function of this second part 221 is to begin curvature by avoiding any clear folding at the end of the reinforcing elements 21-24, likely to damage the flexible element 10 and the conductive tracks that it bears. It should be noted that this bending radius need not be constant and can decrease with distance away from the first part 220. To this end, typically the bending radius of the second part 221 must not be less than 5 mm.

Finally, the printed circuit board according to the invention further comprises at least two stiffening elements 31 and 32 situated respectively on either side of the curvature in the central part 11 of the flexible element 10. These stiffening elements 31, 32 have, for example, at least one substantially planar surface and they are each, for example, formed by a rigid metal part of aluminum.

The stiffening elements 31 and 32 are fixed to the printed circuit board by their planar surface, for example, on the side of the outer face 12. They are fixed either directly to the flexible element 10 if the printed circuit board does not include the reinforcing elements 21 and 23, or to the reinforcing elements 21 and 23 if they exist. The stiffening elements 31 and 32 are fixed also to the mechanical environment of the circuit borne by the printed circuit board according to the invention, for example to a component such as the housing of a light module for a motor vehicle, and so fixed by any known means, such as snapped or crimped pins, clipping, riveting or adhesives. One of the stiffening elements, 32, is, for example. fixed to a mobile part of the mechanical environment, while the other stiffening element 31 is, for example. fixed to a fixed part of this environment. This configuration can be, for example, that of a revolving headlight for the front lighting of a motor vehicle.

It emerges, more particularly in the case described above where a part of the printed circuit board is mobile, driven by the stiffening element 32, that the reinforcing elements 21-24 avoid any over significant deformation and any excessively small bending radius likely to damage the printed circuit board, in the area where the stiffening elements are fixed upon movements of the environment. In addition, by their slightly bent second part, such deformations occurring at the end of the reinforcing elements 21-24 as indicated above are avoided, thus improving the reliability of the corresponding electronic mounting.

This result is obtained with few additional parts and therefore, inexpensively. The resulting printed circuit board also does not have a substantially increased bulk, which is important in a restricted mechanical environment.

The thickness of the reinforcing elements 21-24, like their length and the length of the free central part 11 of the flexible element 10, can be chosen according to the mechanical environment of the printed circuit board and the constraints thereof.

FIG. 2 is a schematic perspective view of the printed circuit board represented in FIG. 1.

In this figure, the flexible element 10 is bent in its central part 11. Also visible in this figure are reinforcing elements 22 (inner) and 23 (outer), of which the first part 220 and second part 221 can be distinguished. In FIG. 2, some lines represent the curvature of the printed circuit board.

The stiffening elements 31 and 32 are schematically represented by simple plates.

In an embodiment of the invention that is not represented, the printed circuit board according to the invention comprises a single reinforcing element 22. The printed circuit board then preferentially comprises a single stiffening element 31 situated on the same side of the curvature in its central part 11 of the flexible element 10 as the reinforcing element 22.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A flexible printed circuit board configured to receive electronic components, comprising an electrically insulating flexible element configured to bear conductive component-connecting tracks, said flexible element being further configured to be bent according to a curvature, wherein said printed circuit board further comprises at least one electrically insulating reinforcing element mechanically secured to said flexible element, extending on one side of said curvature and comprising two parts:
a first part being substantially planar,
a second part exhibiting a predefined curvature, arranged on the side of said curvature of said flexible element,
said at least one reinforcing element being arranged so as to leave a free part for said flexible element to be bent according to said curvature,
wherein said printed circuit board further comprises at least one stiffening element arranged on the same side of said free part as said at least one reinforcing element and fixed to said flexible element or to said at least one reinforcing element.

2. The printed circuit board according to claim 1, wherein said flexible element comprises polyimide.

3. The printed circuit board according to claim 1, wherein said flexible element has a thickness of approximately 110 micrometers.

4. A flexible printed circuit board configured to receive electronic components, comprising an electrically insulating flexible element configured to bear conductive component-connecting tracks, said flexible element being further configured to be bent according to a curvature,
wherein said printed circuit board further comprises at least one electrically insulating reinforcing element mechanically secured to said flexible element, extending on one side of said curvature and comprising two parts:
a first part being substantially planar,
a second part exhibiting a predefined curvature, arranged on the side of said curvature of said flexible element,
said at least one reinforcing element being arranged so as to leave a free part for said flexible element to be bent according to said curvature,
wherein said at least one reinforcing element is arranged on an inner face of said flexible element.

5. The printed circuit board according to claim 4, wherein said at least one reinforcing element is arranged on an outer face of said flexible element.

6. A flexible printed circuit board configured to receive electronic components, comprising an electrically insulating flexible element configured to bear conductive component-connecting tracks, said flexible element being further configured to be bent according to a curvature,
wherein said printed circuit board further comprises at least one electrically insulating reinforcing element mechanically secured to said flexible element, extending on one side of said curvature and comprising two parts:
a first part being substantially planar,
a second part exhibiting a predefined curvature, arranged on the side of said curvature of said flexible element,
said at least one reinforcing element being arranged so as to leave a free part for said flexible element to be bent according to said curvature,
wherein said at least one reinforcing element is arranged on an outer face of said flexible element.

7. A flexible printed circuit board configured to receive electronic components, comprising an electrically insulating flexible element configured to bear conductive component-connecting tracks, said flexible element being further configured to be bent according to a curvature,
wherein said printed circuit board further comprises at least one electrically insulating reinforcing element mechanically secured to said flexible element, extending on one side of said curvature and comprising two parts:
a first part being substantially planar,
a second part exhibiting a predefined curvature, arranged on the side of said curvature of said flexible element,
said at least one reinforcing element being arranged so as to leave a free part for said flexible element to be bent according to said curvature,
wherein said printed circuit board comprises a second reinforcing element, each of said reinforcing elements extending on either side of curvature and said reinforcing elements being arranged so as to leave between them said free part for said flexible element to be bent according to said curvature.

8. The printed circuit board according to claim 7, wherein said printed circuit board comprises at least two stiffening elements arranged on either side of said free part and each fixed to said flexible element or respectively to one of said at least one reinforcing element.

9. A light module for a lighting and/or signaling device notably for a motor vehicle, wherein said light module comprises a printed circuit board according to claim 8, said at least two stiffening elements being also fixed to a component of said light module.

10. The light module according to claim 9, wherein one of said at least two stiffening elements is fixed to said fixed component of said light module and the other of said at least two stiffening elements is fixed to a mobile component of said light module.

11. The light module according to claim 9, wherein one of said at least two stiffening elements is fixed to a first component of said light module and the other of said at least two stiffening elements is fixed to a second component of said light module, said first component and said second component of said light module being provided to be in motion relative to one another.

12. The printed circuit board according to claim 8, wherein said printed circuit board comprises four reinforcing elements arranged facing on either side of said flexible element.

13. The printed circuit board according to claim 7, wherein said printed circuit board comprises four reinforcing elements arranged facing on either side of said flexible element.

14. A light module for a lighting and/or signaling device notably for a motor vehicle, wherein said light module comprises a printed circuit board according to claim 13, said at least two stiffening elements being also fixed to a component of said light module.

15. A flexible printed circuit board configured to receive electronic components, comprising an electrically insulating flexible element configured to bear conductive component-connecting tracks, said flexible element being further configured to be bent according to a curvature,
wherein said printed circuit board further comprises at least one electrically insulating reinforcing element mechanically secured to said flexible element, extending on one side of said curvature and comprising two parts:
a first part being substantially planar,
a second part exhibiting a predefined curvature, arranged on the side of said curvature of said flexible element,
said at least one reinforcing element being arranged so as to leave a free part for said flexible element to be bent according to said curvature, wherein said at least one reinforcing element comprises polyamide.

16. A flexible printed circuit board configured to receive electronic components, comprising an electrically insulating flexible element configured to bear conductive component-connecting tracks, said flexible element being further configured to be bent according to a curvature, wherein said printed circuit board further comprises at least one electrically insulating reinforcing element mechanically secured to said flexible element, extending on one side of said curvature and comprising two parts:

a first part being substantially planar, a second part exhibiting a predefined curvature, arranged on the side of said curvature of said flexible element, said at least one reinforcing element being arranged so as to leave a free part for said flexible element to be bent according to said curvature, wherein said at least one reinforcing element has a thickness of approximately 100 to 600 micrometers.

* * * * *